United States Patent [19]

DeFreese et al.

[11] Patent Number: 4,631,197
[45] Date of Patent: Dec. 23, 1986

[54] APPARATUS AND METHOD FOR ADJUSTING THE FREQUENCY OF A RESONATOR BY LASER

[75] Inventors: Jeffrey A. DeFreese, Mount Prospect; Theodore E. Lind, Lombard, both of Ill.

[73] Assignee: Motorola, Inc., Schaumburg, Ill.

[21] Appl. No.: 755,885

[22] Filed: Jul. 17, 1985

[51] Int. Cl.$^4$ .............................................. B05D 5/12
[52] U.S. Cl. .................................... 427/10; 427/53.1; 427/100
[58] Field of Search ................... 427/10, 53.1, 100, 9; 29/25.35; 219/121 LB

[56] References Cited

U.S. PATENT DOCUMENTS

| | | | |
|---|---|---|---|
| 3,028,262 | 4/1962 | Klingsporn | 427/100 |
| 4,107,349 | 8/1978 | Vig | 427/36 |
| 4,112,134 | 9/1978 | Buynak et al. | 427/10 |
| 4,200,669 | 4/1980 | Schaefer et al. | 427/53.1 |
| 4,281,030 | 7/1981 | Silfvast | 427/42 |
| 4,300,474 | 11/1981 | Livsey | 118/641 |
| 4,427,723 | 1/1984 | Swain | 427/53.1 |

FOREIGN PATENT DOCUMENTS 2523982 12/1976 Fed. Rep. of Germany ..... 427/53.1
1118429 10/1984 U.S.S.R. .............................. 427/53.1

OTHER PUBLICATIONS

Gutfeld, *IBM TDB*, vol. 17, No. 6, Nov. 1974, pp. 1807, 1808.
U.S. Defensive Publication T988,007, Drew et al., Nov. 6, 1979.

*Primary Examiner*—John H. Newsome
*Attorney, Agent, or Firm*—Donald B. Southard; Thomas G. Berry

[57] ABSTRACT

A method and apparatus is disclosed to allow the frequency adjustment of a crystal resonator sealed in a housing. The housing includes a transparent area which has plating material deposited thereon. The plating material is vaporized by a laser beam which sprays onto the crystal resonator thereby adjusting the operating frequency. The laser beam is scanned over the transparent area until an effective amount of plating material has been vaporized to adjust the frequency of the crystal resonator.

21 Claims, 11 Drawing Figures

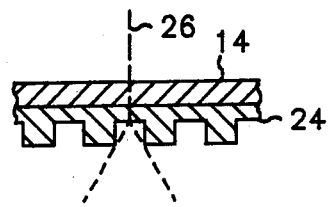
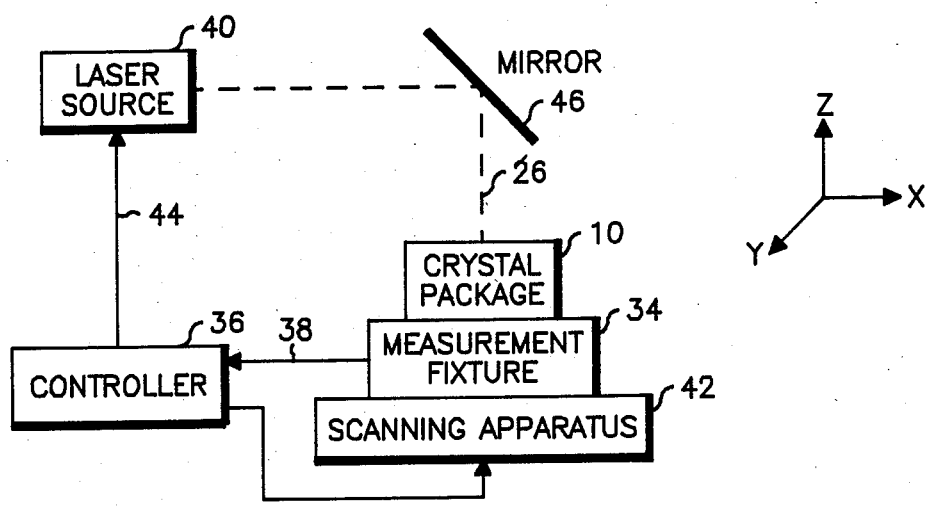
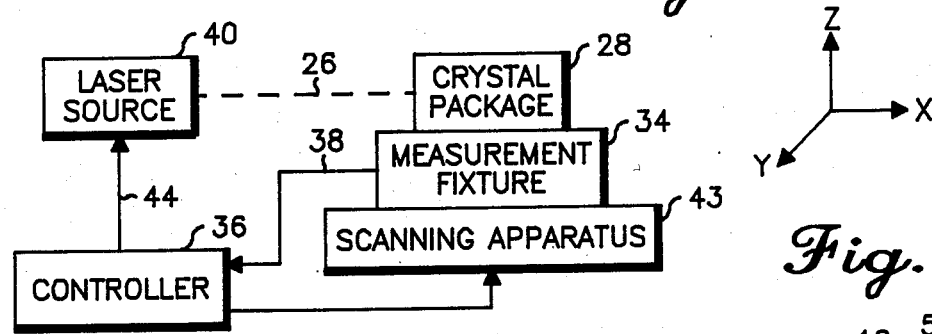
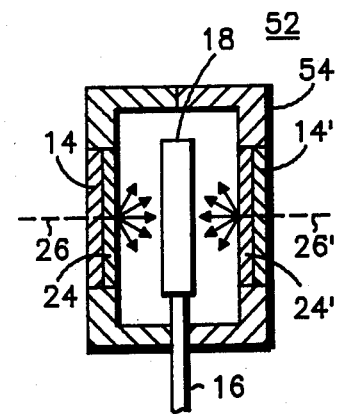
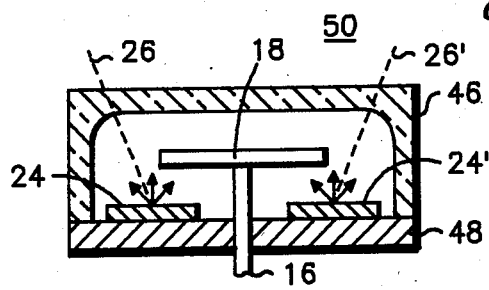

APPARATUS AND METHOD FOR ADJUSTING THE FREQUENCY OF A RESONATOR BY LASER

BACKGROUND OF THE INVENTION

This invention relates generally to vacuum deposition techniques and more particularly to vacuum deposition techniques employing laser beams and is more particularly directed to an improved method and apparatus for adjusting the operating frequency of crystal resonators.

Currently, crystal resonators are adjusted to frequency by placing the semi-finished unit into a vacuum system and evaporating additional plating material (generally gold) onto the electrodes of the unit. The frequency adjusted resonators are then sealed into packages and housings for distribution or use in various electronic circuits. Generally, after being sealed, no further frequency adjustment is possible.

The problem created by this technique is that the frequency of operation may shift between the point the crystal resonator is adjusted, and the point it is sealed. This is particularly true in the typical mass production process where a large quantity of crystal resonators are adjusted and may sit for prolonged periods before being sealed into packages or housings. Generally, the frequency shift is due to exposure to heat or harmful atmospheric conditions (for example, moisture) which may begin to oxidize the plating material.

Some crystal resonator manufacturers adjust the resonator's operating frquency by subtractively trimming the plating material with a laser beam. Typically, the laser power is focused and adjusted to remove a portion of the elctrodes deposited on the crystal. This technique is also prone to subsequent operating frequency shifts since the localized power of the laser beam may change the electrical characteristics (i.e. resistance) of the crystal. Further, the trimmed plating material may migrate to unwanted areas causing crystal contamination. Thus, a need exists to provide a method for accurately adjusting the frequency of a crystal resonator that prevents subsequent frequency shifts and yet is realizable in a mass production process.

SUMMARY OF THE INVENTION

Accordingly, it is an object of the present invention to provide an apparatus and method for adjusting the frequency of crystal resonators that overcomes the definicies of prior art techniques.

Accordingly, these and other objects are achieved in the present apparatus and method for adjusting the frequency of a crystal resonator by laser.

In practicing the invention, a crystal resonator is sealed into a housing having a transparent area. Deposited on the interior surface of the transparent area is a layer of plating material which is vaporized by a laser beam. The vaporized plating material "sprays" onto the resonator's electrodes thereby adjusting the frequency of operation. The laser beam is scanned over the surface of the transparent area until an effective amount of plating material has been vaporized to adjust the frequency of the crystal resonator.

BRIEF DESCRIPTION OF THE DRAWINGS

The features of the present invention which are believed to be novel are set forth with particularity in the appended claims. The invention, together with further objects and advantages thereof, may be understood by reference to the following description, taken in conjunction with the accompanying drawings, and the several figures of which like referenced numerals identify like elements, and in which:

FIG. 1b is a cross sectional view taken along line 1—1 of FIG. 1a;

FIG. 2b is a cross section view taken along line 2—2 of FIG. 2a;

FIGS. 3a–c are alternate embodiments of the plating material deposition technique in accordance with the present invention;

FIG. 4 is a block diagram of a system for adjusting the frequency of the crystal resonator package of FIG. 1a in accordance with the present invention;

FIG. 5 is a block diagram of a system for adjusting the frequency of the crystal resonator package of FIG. 2a;

FIG. 6 is a cross sectional view of an alternate crystal resonator package in accordance with the present invention;

FIG. 7 is a cross sectional view of yet another alternate package for a crystal resonator in accordance with the present invention.

DETAILED DESCRIPTION OF THE PREFERRED EMBODIMENT

Figure 1A:
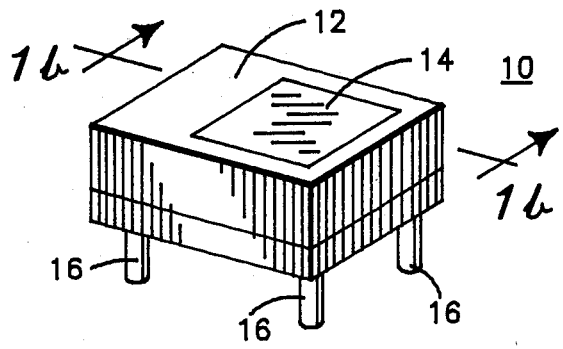
FIG. 1a is a perspective view of a crystal resonator housing in accordance with the present invention.
Figure 1B:
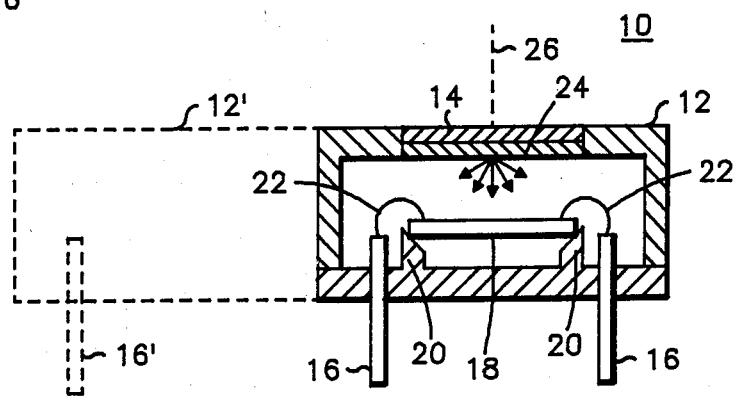

Referring now to FIG. 1a, a crystal resonator housing 10 is comprised of a cover 12 having a transparent area 14, a purality of terminal leads 16, and a base (not shown). In FIG. 1b, a cross sectional view of the crystal resonator housing 10 (taken along line 1—1 of FIG. 1a), illustrates the mounting arrangement for the crystal resonator 18 which is mechanically attached to the mounting pedestals 20 by any appropriate means known in the art. Electrical connection to the terminal leads 16 is made by the bonding wires 22 or other suitable means.

A transparent area 14 is mounted in the housing 12 directly above and parallel to the crystal resonator 18. The transparent area 14 is approximately the same size as the crystal resonator 18 and has a layer of plating material 24 deposited on its interior face. Preferably, the transparent area 14 is made of glass so that a laser beam 26 may transverse the transparent area 14 and vaporize a portion of the plating material 24. Alternately, a transparent or translucent plastic material may be used provided the physical properties are sufficient to allow the laser beam 26 to traverse the transparent area 14 without destruction of the plastic material or disruption of the internal vacuum of the crystal package 10.

The power of the laser beam 26 is adjusted and the beam focused such that it has sufficient power to vaporize a portion of the plating material 24. However, the beam is out of focus with insufficient power to remove any plating material already on the crystal resonator 18. The laser beam 26 may be scanned over the "window" created by the transparent area 14 until an effective amount of plating material 24 is deposited to completely adjust the frequency of the resonator 10 to be within a specified tolerance.

Many crystal resonator manufacturers design more specialized components for certain markets. For example, it is common to have the entire oscillator assembly for a crystal controlled "clock" commonly used in computers, modems and the like contained in the same housing as the crystal resonator 18. Accordingly, the housing 12 may be extended to include the portion 12' to accomodate any additional circuitry required to perform any particular specialized function. Further, a plurality of additional terminal leads 16' may be installed to provide additional electrical contacts.

Figure 2A:
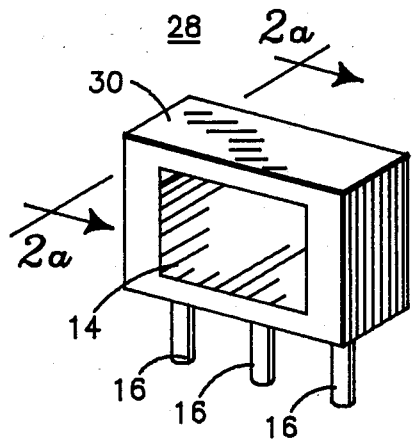
FIG. 2a is a perspective view of an alternate crystal resonator housing in accordance with the present invention.
Figure 2B:
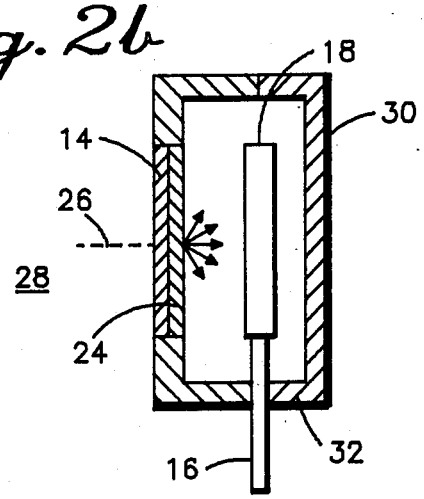

FIG. 2a shows an alternate crystal resonator housing 28 having a substantially vertical housing 30 with the transparent area 14 positioned along one major longitudinal face. Referring now to FIG. 2b (which is a cross sectional view taken along line 2—2 of FIG. 2a), the method of mounting the crystal resonator 18 within the housing 28 can be described. First, the crystal resonator 18 is mounted onto the base member 32 and electrically coupled to the terminal leads 16. A layer of plating material 24 is deposited on one side of the transparent area 14 which is mounted in the cover 30, which, when joined in a cooperating fashion with the base 32, can maintain a vacuum of less than 10 mtorr. The internal atmosphere of the crystal resonator housing 28 (or 10) should be less than 10 mtorr to assure adequate plating material transfer in accordance with the method of the present invention.

The crystal resonator 18 within the housing 28 may be adjusted to frequency by scanning the laser beam 26 over a portion of the entire area of the transparent area 14 until an effective amount of the plating material 24 has been deposited on the quartz crystal resonator 18 to completely adjust the operating frequency within a specified tolerance.

Figure 3A:
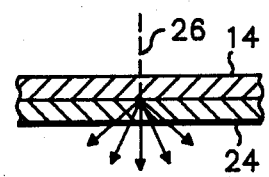
Figure 3B:
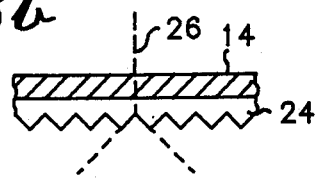

FIGS. 3a-c show alternative ways of controlling the amount of plating material deposited in accordance with the frequency adjustment method of the present invention. Those skilled in the art will appreciate that the plating material 24 can be any appropriate material used in the art and may be gold, silver, aluminum or chrome. However, gold is generally preferred due its to excellent stability over time and temperature characteristics. In FIG. 3a, the plating material 24 has been deposited on the transparent area 14 such that an essentially planar sheet is formed. The laser beam 26 is positioned to perpendicularly contact the transparent area 14 and the plating material layer 24. Accordingly, the vaporized material will "spray" in a COS 2 $\theta$ pattern about the point of beam contact. The COS 2 $\theta$ pattern represents a hemispherically shaped vaporized spray that will deposit plating material on the electrodes of the quartz resonator 18 thereby adjusting the operating frequency.

Some process control engineers may desire a more restricted vaporizing pattern than the one presented in FIG. 3a. Accordingly, in FIG. 3b the plating layer 24 has been shaped to have a series of substantially triangular grooves. The shaping of the plating material layer 24 may be accomplished by a variety of means including performing the transparent area 14 and simply depositing the plating material 24. Alternately, the plating material 24 may be deposited in sheet form (as in FIG. 3a), and appropriately shaped by using a scribe, saw, or chemical etching process as is well known in the art. As the laser beam 26 traverses the transparent area 14 and strikes the serrated shaped plating material layer 24 of FIG. 3b, the vaporized plating material will attempt to spray out in the hemispherical pattern of FIG. 3a. However, the spray will be restricted by the surrounding plating material resulting in a more restricted cone shaped vaporization pattern as seen in FIG. 3b. Still further restriction can be obtained by shaping the plating material 24 in a substantially stepped shaped layer as seen in FIG. 3c. As the laser beam 26 vaporizes the plating material of FIG. 3c, the unique shaping again restricts the vaporized hemispherical pattern thereby controlling the amount of the plating material striking the crystal resonator 18.

Alternately, to provide more resolution in frequency adjustment, a selected area of the plating layer 24 may be shaped in one pattern, and another area shaped to a different pattern. For example, a portion of the plating layer 24 may be shaped in a substantial planar fashion (as in FIG. 3a) providing maximumized plating material transfer, and the remaining portion may be shaped to resemble that of FIG. 3c to obtain a finer plating material transfer (and thus frequency adjustment).

Referring now to FIG. 4, a system for adjusting the frequency of a crystal resonator housing 10 (see FIG. 1a) is shown. The crystal resonator housing 10 is placed on a measurement fixture 34 (which includes any circuitry required to excite the crystal resonator 18) so that the operating frequency may be measured. To facilitate a mass production process, the measurement fixture 34 may include a multiplexing apparatus to allow multiple crystal housings to be inserted onto the measurement fixture 34 and each sequentially adjusted. The measurement fixture communicates with a controller 36 via measurement lines 38. The controller 36 may be a computer or other suitable supervisory system that controls the activation of the laser source 40 and the movement of the scanning apparatus 42. After measuring the operating frequency, the controller 36 activates the laser source 40 by a laser control line 44. The laser beam 26 first contacts a mirror 46 which is positioned to relect the beam onto the crystal resonator housing 10, perpendicularly contacting it somewhere within the transparent area 14 (not shown). This causes a portion of the platting layer 24 deposited on the transparent area 14 to vaporize and adjust the frequency of the crystal package 10. The adjusted frequency is communicated to the controller via the measurement fixture 34 to compare the result with a specified tolerance.

Assuming that the adjusted frequency is not within the specified tolerance, the controller 36 would activate the scanning apparatus 42 which would move the measurement fixture, and hence the crystal resonator housing 10, in the X-Y plane (see reference indicator). Thus, by moving the housing 10, the laser beam 26 is effectively scanned across the transparent area 14. Alternately, the housing 10 and the measurement fixture 34 could be stationary and the laser beam 26 scanned across the transparent area 14 by one or more pivoting mirrors or the like. However, the use of the scanning apparatus 42 is preferred since it is generally simpler to implement and control. The movement of the scanning apparatus 42 would continue until an effective amount of the plating layer 24 is vaporized to appropriately adjust the frequency of the crystal resonator 18 within the housing 10. After the controller 36 determines that the operating frequency is within a specified tolerance, the laser source 40 is deactivated by an appropriate signal on the laser control line 44.

Referring now to FIG. 5, a system for adjusting the frequency of a crystal resonator 18 within a housing 28 (see FIG. 2a) is shown. The procedure is substantially similar to that described in conjunction with FIG. 4, however, the scanning apparatus 43 now moves the measurement fixture 34 (and the crystal housing 28) in the Y-Z plane (see reference indicator) to scan the laser beam 26 over the transparent area 14 (not shown). As previously stated, to facilitate the mass production, the measurement fixture 34 may include a multiplexing arrangement to allow multiple crystal resonators to be adjusted in one operation.

Referring now to FIG. 6, an alternate housing arrangement is shown wherein a crystal resonator 18 is mounted on the a base member 48 which has plating material 24 and 24' deposited along the two sides of the quartz resonator 18. The transparent cover portion 46 is sealed to the base member 48 creating the required vacuum internal to the crystal housing 50. The two laser beams 26 and 26' are then focused through the transparent cover 46 to contact the plating material 24 and 24'. The laser beams 26 and 26' may be scanned down the sides of the crystal resonator 18 until an appropriate amount of plating material has been vaporized and deposited to adjust the operating frequency of the crystal resonator 18. The housing 50 has an advantage since the laser beams 26 and 26' do not contact the crystal resonator 18, thus, the laser power control and beam focusing are not critical.

Referring now to FIG. 7, yet another alternate crystal housing 52 is shown wherein the cover 54 has two transparent areas 14 and 14', each having respectively a plating layer 24 and 24' positioned on both major faces of the crystal resonator 18. Two laser beams 26 and 26' are then scanned across the respective transparent areas 14 and 14' each depositing plating material onto the crystal resonator 18 thereby adjusting the operating frequency. The platting areas 24 and 24' may be shaped by any appropriate means described in conjunction with FIGS. 3a–c to control the amount of plating material deposited. Of course, plating layer 24 may have one shape, for example planar, and layer 24' may have a different shape, for example, serrated to create a "coarse" and "fine" frequency adjustment.

While a particular embodiment of the invention has been shown and described above, it should be understood that the invention is not limited thereto since many modifications may be made. It is therefore contemplated to cover by the present application any and all such modifications that may fall within the true spirit and scope of the basic underlying principles disclosed and claimed herein.

What is claimed is:

1. An improved crystal resonator device, comprising:
   a crystal resonator;
   a base constructed and arranged to receive said crystal resonator;
   at least two terminal leads extending through said base electrically connected to said crystal resonator; and
   a cover having at least one transparent area with an effective amount of plating material deposited thereon forming a layer having at least one goemetrically shaped surface;
   whereby, said geometrically shaped surface operates to control the vaporization of said plating material.

2. The device of claim 1 wherein said transparent area is positioned substantially above and parallel to the position of the crystal resonator.

3. The device of claim 1, wherein said transparent area is comprised of glass.

4. The device of claim 1, wherein said transparent layer is comprised of plastic.

5. The device of claim 1, wherein said plating material is comprised of gold.

6. The device of claim 1, wherein said plating material is comprised of silver.

7. The device of claim 1, wherein said plating material is comprised of aluminum.

8. The device of claim 1, wherein said plating material is comprised of chrome.

9. The device of claim 1, wherein said base and said cover are cooperatively sealed to maintain a vacuum within the housing.

10. The device of claim 9, wherein said vacuum is less than 10 mtorr.

11. The device of claim 1, wherein said geometrically shaped surface of said plating material comprises a substantially sheet shaped layer.

12. The device of claim 1, wherein said geometrically shaped surface of said plating material comprises a substantially serrated shaped layer.

13. The device of claim 1, wherein said geometrically shaped surface of said plating material comprises a substantially stepped shaped layer.

14. A method for fabricating a crystal resonator to a specified operating frequency, comprising the steps of:
   mounting the crystal resonator within a housing having at least one transparent area with an effective amount of plating material deposited thereon;
   shaping said plating material such that at least one geometrically shaped surface is formed thereon;
   measuring the operating frequency of the crystal resonator; and
   vaporizing said plating material with a laser beam such that the vaporization pattern of said plating material is controlled by said geometrically shaped surface thereby adjusting the crystal resonator's operating frequency.

15. The method of claim 14, wherein said plating material is comprised of gold.

16. The method of claim 14, wherein said plating material is comprised of silver.

17. The method of claim 14, wherein said plating material is comprised of aluminum.

18. The method of claim 14, wherein said plating material is comprised of chrome.

19. The method of claim 14, wherein said mounting step further includes the step of sealing said housing such that the internal atmosphere of said housing is a vacuum.

20. The method of claim 19, wherein said internal vacuum of the housing is less than 10 mtorr.

21. The method of claim 14, which includes the further step of scanning the laser beam over said transparent area until an effective amount of plating material has vaporized to adjust the crystal resonator's operating frequency.

* * * * *